United States Patent [19]
Joseph et al.

[11] Patent Number: 5,835,442
[45] Date of Patent: Nov. 10, 1998

[54] EDRAM WITH INTEGRATED GENERATION AND CONTROL OF WRITE ENABLE AND COLUMN LATCH SIGNALS AND METHOD FOR MAKING SAME

[75] Inventors: James Dean Joseph, Monument; Dion Nickolas Heisler; Doyle James Heisler, both of Colorado Springs, all of Colo.

[73] Assignee: Enhanced Memory Systems, Inc., Colorado Springs, Colo.

[21] Appl. No.: 620,450

[22] Filed: Mar. 22, 1996

[51] Int. Cl.$^6$ ................................. G11C 8/00
[52] U.S. Cl. ................ 365/230.08; 365/189.12; 365/193; 365/233
[58] Field of Search ............. 365/230.08, 189.05, 365/193, 189.12, 233

[56] References Cited

U.S. PATENT DOCUMENTS

| | | | |
|---|---|---|---|
| 5,083,296 | 1/1992 | Hara et al. ................ | 365/230.08 |
| 5,371,711 | 12/1994 | Nakayama .................. | 365/189.05 |
| 5,390,149 | 2/1995 | Vogley et al. .............. | 365/189.05 |
| 5,446,691 | 8/1995 | North et al. ............... | 365/230.03 |
| 5,539,696 | 7/1996 | Patel ..................... | 365/189.05 |
| 5,721,862 | 2/1998 | Sartore et al. ............. | 365/189.05 |

OTHER PUBLICATIONS

Bursky, Dave, "Combination DRAM–SRAM Removes Secondary Caches, " Electronic Design, Jan. 23, 1992, pp. 39–40, 42–43.

Jones, Fred, "A New Era of Fast Dynamic RAMs," IEEE Spectrum, Oct. 1992, pp. 43–45, 48, 49.

Bondurant, David W., "High–Performance DRAMs, " Electronic Products, Jun. 1993, pp. 47–51.

Sofwin Reports, The Journal of Computing Performance & Productivity, Nov. 1994, vol. 3, Issue 3, © 1994 Sofwin Publishing, P.O. Box 280349, Lakewood, Colorado 80228–0349.

"High–Performance Specialty DRAMs," brochure, Enhanced Memory Systems, Inc., 1850 Ramtron Drive, Colorado Springs, CO 80921, 1996.

"12ns Enhanced Dynamic RAM Family,"Product Summary, Enhanced Memory Systems, Inc., 1850 Ramtron Drive, Colorado Springs, CO 80921, ©1996.

"Let's Race," 12ns/15ns EDRAM Product Brochure, 1996, Enhanced Memory Systems, Inc., 1850 Ramtron Drive, Colorado Springs, CO 80921.

"Let's Race," 1996 Shortform Catalog, Enhanced Memory Systems, Inc., 1850 Ramtron Drive, Colorado Springs, CO 80921.

"Nineteen Ninety–Seven Databook," Enhanced Memory Systems, Inc., 1850 Ramtron Drive, Colorado Springs, CO 80921.

*Primary Examiner*—Son T. Dinh
*Attorney, Agent, or Firm*—Peter J. Meza, Esq.; William J. Kubida, Esq.; Holland & Hart LLP

[57] ABSTRACT

An EDRAM device includes an EDRAM memory array on a semiconductor chip. A row enable signal generator and a column address latch signal generator are provided on the same semiconductor chip for generating row enable and column address latch signals for application to the EDRAM memory array.

13 Claims, 1 Drawing Sheet

EDRAM WITH INTEGRATED GENERATION AND CONTROL OF WRITE ENABLE AND COLUMN LATCH SIGNALS AND METHOD FOR MAKING SAME

BACKGROUND OF THE INVENTION

1. Field of the Invention

This invention relates to improvements in EDRAM devices and methods for making same, and more particularly to improvements in EDRAM devices in which row enable and column latch signals are integrated into EDRAM devices, and methods for making same, and additionally this invention relates to improvements in computer systems including EDRAM devices in which row enable and column latch signals have been integrated into EDRAM devices used in the system.

2. Background Information

Enhanced DRAM (EDRAM) devices have been receiving recent increased interest, primarily due to their significantly increased speed of operation compared to the speed of ordinary DRAM devices. A typical EDRAM is physically similar to a standard page mode or static column DRAM with the addition of an integrated SRAM cache and an internal controller which allows the EDRAM to operate much like a page mode or static column DRAM.

The cache of the EDRAM is tightly coupled with the memory array as row registers, and memory reads occur from the cache. When the internal comparator detects a page "hit", only the SRAM cache is accessed, and data is available at the column address. This results in a significant decrease in memory access times. When a page read "miss" is detected, the new memory array row is loaded into the cache and data is made available at the output. Subsequent reads within the page (burst read, local instructions, or data) can continue at fast cycle times.

More particularly, in a typical EDRAM, a row enable (/RE) signal is used to initiate DRAM read and write and operations and to latch a row address (as well as the states of the write/read (W/R) and refresh (/F) signals) in the device. A column address latch (/CAL) signal is used to latch the column address, and, in combination with the write enable (/WE) signal, to trigger write operations. Thus, a read is initiated by clocking the write/read (W/R) signal low with the chip select signal (/S) low and with the refresh (/F) and column address latch (/CAL) signals high.

In operation, the EDRAM compares a new row address to the address of the row last read, which has been latched in the SRAM cache. If the row addresses match, the requested data is already in the SRAM cache, and no DRAM memory reference is initiated. The data specified by the column address is then made available from the SRAM cache to the output pins. On the other hand, if the new row address and last row read addresses do not match, the requested data is not in the SRAM cache. The data contained in the new row address must then be fetched from the DRAM and placed in the SRAM cache. The fetched data at the specified column address is then made available at the output.

Since reads occur from the cache, the memory array precharge can occur concurrently without degrading performance. The on-chip refresh counter, with an independent refresh bus, allows the EDRAM also to be refreshed during cache reads. On the other hand, memory writes are internally posted and are directed to the DRAM array. During a write "hit", the on-chip comparator activates a parallel write path to the cache to maintain coherency.

In the past, however, in order to incorporate EDRAM devices into a system, EDRAM designers have been required to provide the row enable (/RE) and column address latch (/CAL) signals externally from the EDRAM devices. These enable and latch signals have been supplied, for example, from a properly programmed FPGA, PLA, or other such device. See, for instance, the controller example described in "EDRAM Controller For Intel 486DX2 50 MHz & 66 MHz Microprocessors," RAMTRON SPECIALTY MEMORY PRODUCTS, October, 1994, pp. 2-135–2-141, incorporated herein by reference. By using an external memory controller, it is difficult to take full advantage of the speed capabilities of the EDRAM, especially in view of the speed standards increasingly being required by today's high speed processors, in which timing functions can be critical.

SUMMARY OF THE INVENTION

In light of the above, therefore, it is an object of the invention to provide an improved EDRAM and method for making same.

It is another object of the invention to provide an improved method for operating an EDRAM in which row enable (/RE) and column address latch (/CAL) signals are not required to be supplied externally from the EDRAM device.

It is another object of the invention to provide an improved computer system that includes faster EDRAM devices.

One of the technical advantages of the invention is that it makes possible faster average speeds of EDRAMs to be realized.

It is another technical advantage that fewer supporting parts and design requirements are needed to integrate EDRAM devices into computer products, or the like, which use DRAM or other memory devices.

These and other objects, features and advantages of the invention will be apparent to those skilled in the art from the following detailed description of the invention, when read in conjunction with the accompanying drawings and appended claims.

The EDRAM device of this invention generates and controls row enable (/RE) and column address latch (/CAL) signals, which are two of the most critical timing signals, as an internal function of the device, thereby eliminating the burden of dealing with controller signal delays. Thus, according to a broad aspect of the invention, an EDRAM device is provided which includes an EDRAM memory array on a semiconductor chip and a row enable signal generator on the same semiconductor chip for generating row enable signals for application to the EDRAM memory array.

According to another broad aspect of the invention, an EDRAM device is provided which includes an EDRAM memory array on a semiconductor chip and a column address latch signal generator on the same semiconductor chip for generating column address latch signals for application to the EDRAM memory array.

BRIEF DESCRIPTION OF THE DRAWINGS

The invention is illustrated in the accompanying drawings, in which.

DETAILED DESCRIPTION OF THE PREFERRED EMBODIMENTS

Figure 1:
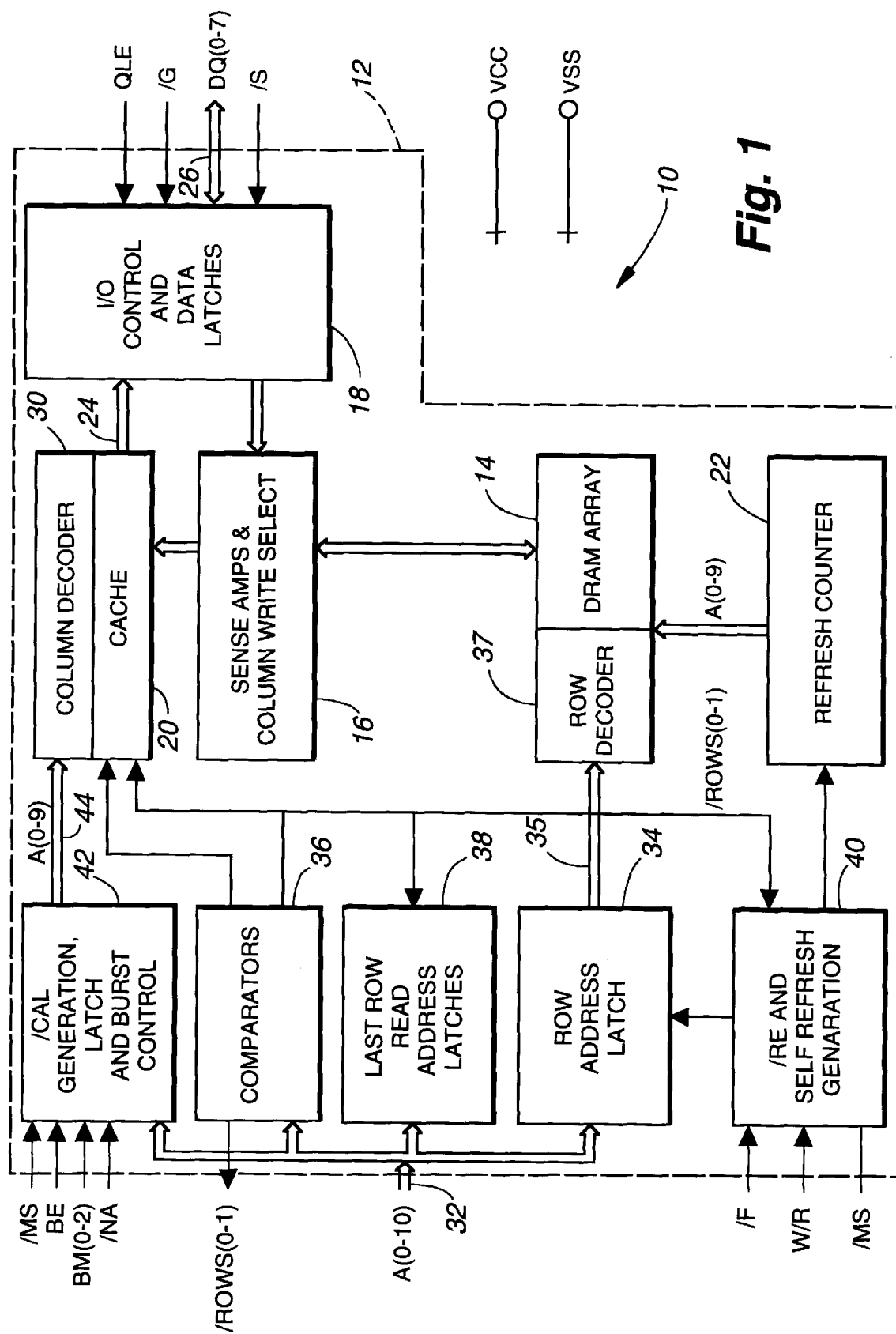
FIG. 1 is a block diagram showing an EDRAM architecture that generates and controls row enable (/RE) and column address latch (/CAL) signals integrated as a part of an EDRAM device on a single semiconductor substrate, according to a preferred embodiment of the invention.

A preferred embodiment of the invention is shown in FIG. 1, which is a block diagram of an EDRAM device or module 10, showing an EDRAM architecture that generates and controls row enable (/RE) and column address latch (/CAL) signals as a part of the operation of the EDRAM device. The use of an EDRAM device 10, according to the architecture of FIG. 1, eliminates the need for a separate, external controller circuit or device to provide /RE and /CAL signals, as required by EDRAM devices in the past. The EDRAM device 10 is preferably integrated onto a single integrated circuit chip 12, contained in a single device package, which may be, for example, a 28 pin SOJ package, or other appropriate package.

The EDRAM device 10 has an on-chip DRAM array 14, which may be, for example, 2048 bits×2048 bits in size, or other appropriate size, with sense amplifiers and column write select circuitry 16, which is controlled by an I/O control circuit 18 to amplify the data read from the DRAM array 14 for delivery to an cache memory 20. The cache memory 20 is typically provided by one or more rows of SRAM cells, in known manner. The cache 20 typically provides a set of registers between the column decoder 30 and the DRAM array 14 for storing at least a portion of the data associated with a specified subset of memory cells last accessed from said DRAM array 14.

An on-chip refresh counter 22 supplies refresh addresses to the DRAM array 14. The refresh counter is responsive to an externally supplied refresh signal and is coupled to refresh the memory array while data stored in cache 20 is placed on the data bus, while said row enable signal is not asserted.

The SRAM cache memory 20 provides the data contained therein to the I/O control and data latches 18 on a data bus 24 for output when the data contained therein is read. The I/O control and data latches circuitry 18 receives as inputs an extended data output control signal (QLE), an output enable (/G) signal, and a chip select (/S) signal, and controls data input and output to and from the device 10 on a data output bus 26. The data bus 26 serves to provide a signal indicative of data associated with specified portions of the memory cells within the DRAM array 14.

A column decoder circuit 30 is provided to determine which data within the cache 20 is delivered to the I/O control circuit 18. The SRAM cache memory 20 may be, for example, a 2048 bits×1 row register of SRAM memory cells to which selected rows of data from corresponding DRAM rows may be selectively written for output.

Row and column addresses are multiplexed to the EDRAM device 10 on input address lines 32. The row addresses are applied to the DRAM array 14 by a row address latch 34, which applies a row address portion of the input address to the DRAM array 14 on an internal row address bus 35 to the row decoder 37 of the DRAM array 14. The row decoder and column decoder are responsive to an externally supplied address signal on the address bus for accessing a specified subset of memory cells within the DRAM array 14. To enable the cache operation of the device 10, the row addresses are connected to comparator circuits 36 and last row read address latches 38. The comparator circuits 36 provide control signals to the SRAM cache 20, as well as to the last row read address latches 38, in known manner. The last row read register 38 is coupled to the address bus 32 for indicating an address of the data stored in the set of registers in the cache 20. The comparator circuits 36 associated with the address bus and the last row read register cause the contents of the set of registers of the cache 20 to be placed on the data bus 26 if the address indicated in the last row read register corresponds to the current address signal.

To provide the row enable (/RE) signals within the device 10, a row enable (/RE) and self refresh generation circuit 40 is provided on-chip. The row enable (/RE) and self refresh generation circuit 40 receives the refresh signal (/F), the write-read (W/R) signal and a memory strobe (/MS) signal on is inputs, as well as an output from the comparator circuits 36, which may include row status indicating signals 0 and 1 from the comparators 36.

The row enable (/RE) and self refresh generation circuit 40 serves to provide an output to the refresh counter 22 to initiate a refresh cycle, as well as to provide row address control signals to the row address latch circuit 34. Although the generation of the /RE signals has not been heretofore generated on-chip, as illustrated, the function of the /RE signal, once generated, may be the same as or similar to the function of the /RE signal that was externally applied, for example in its control of the row address latch circuit 34 and refresh counter 22.

The /RE signal generation function provided by the EDRAM circuitry function represented by the /RE and Self Refresh Generation box 40 may be provided by discrete logic circuits, a programmable logic array circuit, or the like, that provides outputs in response to signal inputs in accordance with the following Table I, in which the high (H) or low (L) states of the respective signals in the top column of the table are indicated:

TABLE I

| /RE | /S | /MS | /F | /ROW 0 | /ROW 1 |
|-----|----|-----|-----|--------|--------|
| L | L | L | H | L | H |
| L | L | L | H | H | L |
| L | X | X | L | X | X |
| H | H | H | H | H | H | and in which:
 /RE is a row enable signal;
 /S is a chip select signal;
 /MS is a memory strobe signal
 /F is a refresh signal; and
 ROWS 0 and 1 are "hit" or "miss" cache status indicating signals for row addresses 0 and 1.

It will be appreciated by those skilled in the art that the provisions of the signals according to Table I may be implemented in various ways. For example, the signals may be developed by a programmed logic or gate array, or merely through the use of discrete logic elements on-chip. One hardware embodiment that can be used to realize the logic states of /RE in response to the /S, /MS, /F, ROW 0 and ROW 1 signals, for instance is a four input AND gate receiving /S, /MS, ROW 0, and ROW 1 signals applied to its inputs, and with its output ORed with the /F signal in an OR gate.

It will also be appreciated that the ROW 0 and ROW 1 signals are developed to provide an indication of the status of the particular function being required of the EDRAM device 10, and can be regarded as "hit" or "miss" cache status indicating signals for row addresses 0 and 1. The outputs /ROW 0 and /ROW 1 are developed by the comparators circuit 36, which provides an output indicating the status of a cache hit or miss, according to the following table III:

TABLE III

| Cycle | /ROW 0 | /ROW 1 |
|---|---|---|
| Read Hit (Row 0) | 0 | 1 |
| Read Hit (Row 1) | 1 | 0 |
| Read Miss (Both Rows) | 1 | 1 |
| Idle | 1 | 1 |

To provide column address latch (/CAL) signals to the device 10, a column address latch (/CAL) generation, latch, and burst control circuit 42 is provided. The column address latch (/CAL) generation, latch, and burst control circuit 42 receives as inputs the memory strobe (/MS) signal, a burst enable (BE) signal, burst mode control signals (BM(0–2)), and a next address (/NA) signal. It provides a latched column address to the column decoder 30 on an internal column address bus 44. The column address latch (/CAL) generation and burst control circuit 42 also receives addresses from the external input address bus 32.

In addition, the /CAL signal generation function provided by the EDRAM circuitry function represented by the box 42 may be provided by discrete logic circuits that provide outputs in response to signal inputs in accordance with the following truth Table IV:

TABLE IV

| /CAL | /S | W/R |
|---|---|---|
| L | L | H |
| H | X | L | in which:
/CAL is a column latch signal;
/S is a chip select signal; and
W/R is a write/read signal.

It will be appreciated by those skilled in the art that the provisions of the signals according to Table IV also may be implemented in various ways. For example, the signals may be developed by a programmed logic or gate array, or merely through the use of discrete logic elements on-chip. One hardware embodiment that can be used to realize the logic states of /CAL in response to the /S, and W/R signals, for instance may be an OR gate receiving an inverted W/R signal on one input and the /S signal on the other input. Although the generation of the /CAL signals has not been heretofore generated on-chip, as illustrated, the function of the /CAL signal, once generated, may be the same as or similar to the function of the /CAL signal that was formerly externally applied, for example in its control of the column address latch function within the circuit 42.

A table of operating modes of the device 10 provided in response to the various input signals is shown in the following Table V:

TABLE V

| Function | /S | /MS | /RE | /CAL | W/R | /NA | /F | A | Comment |
|---|---|---|---|---|---|---|---|---|---|
| Read Hit (Leadoff Cycle) | L | L | L | H | L | H | H | Column | Data in Cache |
| Read Miss (Leadoff Cycle) | L | L | L | H | L | H | H | Row | DRAM Row to Cache |
| Write (Leadoff Cycle) | L | L | L | L | H | H | H | Row | Write to DRAM & Cache |
| Burst Read Hit or Miss | L | L | L | H | L | H/L | H | Column | Data in Cache |
| Burst Write | L | L | L | L | H | H/L | H | Row | Write to DRAM & Cache |
| Refresh | X | X | L | X | X | X | L | X | | in which:
/S is a chip select signal;
/MS is a memory strobe signal;
/RE is a row enable signal;
/CAL is a column latch signal;
W/R is a write/read signal;
/NA is a next address signal
/F is a refresh signal; and
A is an addressing mode.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. An integrated circuit memory device incorporating a memory array having a row decoder and a column decoder responsive to an externally supplied address signal on an address bus for accessing a specified subset of memory cells within said array, and further including a data bus for providing a signal indicative of data associated with said specified portion of memory cells, comprising:

a set of registers between said column decoder and said memory array for storing at least a portion of said data associated with said specified subset of memory cells last accessed from said memory device;

a last row read register coupled to said address bus for indicating an address of said data stored in said set of registers;

a comparator associated with said address bus and said last row read register for causing said contents of said set of registers to be placed on said data bus if said address indicated in said last row read register corresponds to said address signal; and a row enable signal generator responsive to memory strobe and chip select signals for providing a row enable signal for selectively retaining a row address signal portion of said address signal on said address bus.

2. The integrated circuit memory device of claim 1 wherein said row enable signal generator provides said row enable signal when said memory strobe and chip select signals are concurrently low.

3. The integrated circuit memory device of claim 1 wherein said memory strobe and chip select signals are supplied externally from said memory device.

4. The integrated circuit memory device of claim 1 further comprising a column address latch signal generator that provides a predetermined column address latch signal throughout a read cycle for selectively retaining a column address signal portion of said address signal on said address bus.

5. The integrated circuit memory device of claim 1 further comprising a refresh control circuit and a refresh counter responsive to an externally supplied refresh signal and coupled to refresh said memory array while data stored in said set of registers is placed on said data bus while said row enable signal is not asserted.

6. An integrated circuit memory device incorporating a dynamic random access memory array having associated row and column decoders responsive to an externally supplied address signal on an address bus for accessing a specified subset of memory cells within said array, said address signal including row and column address portions and said memory device further including a data bus for providing a signal indicative of data associated with said specified portion of memory cells, comprising:

a static random access memory cache associated with said memory array and interposed between said column decoder and said memory array for storing at least a portion of said data associated with said specified subset of memory cells last accessed from said memory device;

a row enable signal generator responsive to memory strobe and chip select signals for providing a row enable signal for selectively retaining a row address signal portion of said address signal;

a row address circuit for operatively controlling said memory cache and a row address latch circuit coupled between said address bus and said row decoder, said row address circuit responsive to a row enable signal from said row enable signal generator;

a column address latch signal generator that provides a predetermined column address latch signal throughout a write cycle;

a column address latch circuit coupled between said address bus and said column decoder, said column address latch circuit responsive to a column address latch signal from said column address latch signal generator for selectively retaining a column address signal portion of said address signal on said address bus;

whereby said data stored in said memory cache may be placed on said data bus by supplying said column address portion of said address signal on said address bus.

7. The memory device of claim 6 further comprising:

a refresh control circuit responsive to an externally applied refresh signal for refreshing said memory array.

8. The memory device of claim 6 wherein said data stored in said memory cache may be placed on said data bus while said refresh control circuit refreshes said memory array.

9. An EDRAM device, comprising:

an EDRAM memory module on a semiconductor chip;

and means on said semiconductor chip for generating row enable signals for application to said EDRAM memory module according to the following table:

| /RE | /S | /MS | /F | /ROW 0 | /ROW 1 |
|-----|----|----|----|--------|--------|
| L | L | L | H | L | H |
| L | L | L | H | H | L |
| L | X | X | L | X | X |
| H | H | H | H | H | H | in which:

/RE is a row enable signal;

/S is a chip select signal;

/MS is a memory strobe signal;

/F is a refresh signal; and

/ROWS 0 and 1 are "hit" or "miss" cache status indicating signals for row addresses 0 and 1.

10. The EDRAM device of claim 9 further comprising means for providing status indicating signals according to the following table:

| Cycle | /ROW 0 | /ROW 1 |
|-------|--------|--------|
| Read Hit (Row 0) | 0 | 1 |
| Read Hit (Row 1) | 1 | 0 |
| Read Miss (Both Rows) | 1 | 1 |
| Idle | 1 | 1 |

11. A computer system having a central processor unit and an associated EDRAM memory module, said EDRAM memory module including, on a semiconductor chip, a plurality of memory devices incorporating a primary memory array and a secondary cache memory, and further including a last row read register for indicating an address of the last row read from said memory module by said data processor, said computer system further comprising:

means on said semiconductor chip for generating row enable signals for application to said EDRAM memory module according to the following table:

| /RE | /S | /MS | /F | /ROW 0 | /ROW 1 |
|-----|----|----|----|--------|--------|
| L | L | L | H | L | H |
| L | L | L | H | H | L |
| L | X | X | L | X | X |
| H | H | H | H | H | H | in which:

/RE is a row enable signal;

/S is a chip select signal;

/MS is a memory strobe signal;

/F is a refresh signal; and

/ROWS 0 and 1 are "hit" or "miss" cache status indicating signals for row addresses 0 and 1;

and a column address latch signal generator on said semiconductor chip for generating column address latch signals for application to said EDRAM memory module.

12. The computer system of claim 11 further comprising means for providing status indicating signals according to the following table:

| Cycle | /ROW 0 | /ROW 1 |
|---|---|---|
| Read Hit (Row 0) | 0 | 1 |
| Read Hit (Row 1) | 1 | 0 |
| Read Miss (Both Rows) | 1 | 1 |
| Idle | 1 | 1 |

13. A computer system having a central processor unit and an associated EDRAM memory module, said EDRAM memory module including, on a semiconductor chip, a plurality of memory devices incorporating a primary memory array and a secondary cache memory, and further including a last row read register for indicating an address of the last row read from said memory module by said data processor, said computer system further comprising:

a row enable signal generator on said semiconductor chip for generating row enable signals for application to said EDRAM memory module;

and means on said semiconductor chip for generating column address latch signals for application to said EDRAM memory module according to the following table:

| /CAL | /S | W/R |
|---|---|---|
| L | L | H |
| H | X | L | in which:

/CAL is a column address latch signal;

/S is a chip select signal; and

W/R is a write/read signal.

* * * * *